US011875851B2

(12) United States Patent
Maejima

(10) Patent No.: US 11,875,851 B2
(45) Date of Patent: Jan. 16, 2024

(54) SEMICONDUCTOR MEMORY DEVICE

(71) Applicant: KIOXIA CORPORATION, Tokyo (JP)

(72) Inventor: Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/080,524

(22) Filed: Dec. 13, 2022

(65) Prior Publication Data

US 2023/0113054 A1   Apr. 13, 2023

Related U.S. Application Data

(63) Continuation of application No. 17/502,573, filed on Oct. 15, 2021, now Pat. No. 11,568,936, which is a (Continued)

(30) Foreign Application Priority Data

Mar. 2, 2016 (JP) ................... 2016-040290

(51) Int. Cl.
*G11C 16/26* (2006.01)
*G11C 16/04* (2006.01)
(Continued)

(52) U.S. Cl.
CPC .......... *G11C 16/0483* (2013.01); *G11C 16/08* (2013.01); *G11C 16/24* (2013.01);
(Continued)

(58) Field of Classification Search
CPC ..... G11C 16/0483; G11C 16/08; G11C 16/24; G11C 16/26; G11C 16/28; G11C 16/3427;
(Continued)

(56) References Cited

U.S. PATENT DOCUMENTS 7,852,676 B2   12/2010 Maejima
8,107,286 B2   1/2012 Itagaki et al.
(Continued)

FOREIGN PATENT DOCUMENTS

JP   2009266281 A   11/2009
JP   2011070730 A   4/2011
(Continued)

OTHER PUBLICATIONS

Taiwan Office Action dated Dec. 12, 2017, mailed in counterpart Taiwan Application No. 106116788, 16 pages (with translation).

*Primary Examiner* — Xiaochun L Chen

(74) *Attorney, Agent, or Firm* — Kim & Stewart LLP

(57) ABSTRACT

A semiconductor memory device includes a memory cell array having memory strings that include memory cells and first and second selection transistors. During a read operation, a controller applies a first voltage higher than ground to a source line, and a second voltage to a first and second selection gate lines that are connected to a selected memory string. The second voltage is also applied to the first selection gate lines connected to non-selected memory strings during a first period of the read operation. A third voltage higher than ground and lower than the second voltage is applied to the first selection gate lines connected to non-selected memory strings during a second period of the read operation subsequent to the first period.

13 Claims, 14 Drawing Sheets

Related U.S. Application Data continuation of application No. 16/883,591, filed on May 26, 2020, now Pat. No. 11,176,998, which is a continuation of application No. 16/540,529, filed on Aug. 14, 2019, now Pat. No. 10,706,931, which is a continuation of application No. 15/977,543, filed on May 11, 2018, now Pat. No. 10,418,104, which is a continuation of application No. 15/498,029, filed on Apr. 26, 2017, now Pat. No. 10,008,269, which is a continuation of application No. 15/231,715, filed on Aug. 8, 2016, now Pat. No. 9,666,296.

(51) Int. Cl.
*G11C 16/28* (2006.01)
*G11C 16/08* (2006.01)
*G11C 16/24* (2006.01)
*G11C 16/34* (2006.01)
*G11C 16/32* (2006.01)

(52) U.S. Cl.
CPC .............. *G11C 16/26* (2013.01); *G11C 16/28* (2013.01); *G11C 16/3427* (2013.01); *G11C 16/32* (2013.01)

(58) Field of Classification Search
CPC ....... G11C 16/32; G11C 5/147; G11C 7/1057; G11C 16/30
See application file for complete search history.

(56) References Cited

U.S. PATENT DOCUMENTS

| | | | |
|---|---|---|---|
| 8,199,573 B2 | 6/2012 | Fukuzumi et al. | |
| 8,724,397 B2 | 5/2014 | Asaoka et al. | |
| 8,971,115 B2 | 3/2015 | Hosono | |
| 9,111,620 B2 | 8/2015 | Tanzawa | |
| 9,318,200 B2 | 4/2016 | Sakui | |
| 9,536,618 B2 | 1/2017 | Zhao et al. | |
| 9,666,296 B1 | 5/2017 | Maejima | |
| 10,008,269 B2 | 6/2018 | Maejima | |
| 10,418,104 B2 | 9/2019 | Maejima | |
| 10,706,931 B2 | 7/2020 | Maejima | |
| 11,176,998 B2 | 11/2021 | Maejima | |
| 2002/0008990 A1* | 1/2002 | Satoh | G11C 11/5635 365/185.03 |
| 2007/0252201 A1 | 11/2007 | Kito et al. | |
| 2010/0097858 A1 | 4/2010 | Tokiwa et al. | |
| 2011/0069552 A1 | 3/2011 | Itagaki et al. | |
| 2013/0058165 A1 | 3/2013 | Maejima | |
| 2013/0128669 A1 | 5/2013 | Mokhlesi et al. | |
| 2014/0085982 A1 | 3/2014 | Asaoka | |
| 2014/0247658 A1 | 9/2014 | Hosono | |
| 2014/0254270 A1 | 9/2014 | Maejima | |
| 2014/0269082 A1 | 9/2014 | Mokhlesi et al. | |
| 2014/0321216 A1 | 10/2014 | Tanzawa | |
| 2015/0287472 A1 | 10/2015 | Zhao et al. | |
| 2015/0325306 A1 | 11/2015 | Lee | |
| 2016/0042791 A1 | 2/2016 | Sakui | |
| 2016/0055911 A1 | 2/2016 | Nguyen et al. | |
| 2016/0189770 A1 | 6/2016 | Abe | |
| 2016/0379717 A1 | 12/2016 | Shiino et al. | |
| 2022/0036951 A1 | 2/2022 | Maejima | |

FOREIGN PATENT DOCUMENTS

| | | |
|---|---|---|
| JP | 2013089272 A | 5/2013 |
| JP | 2014170598 A | 9/2014 |

* cited by examiner

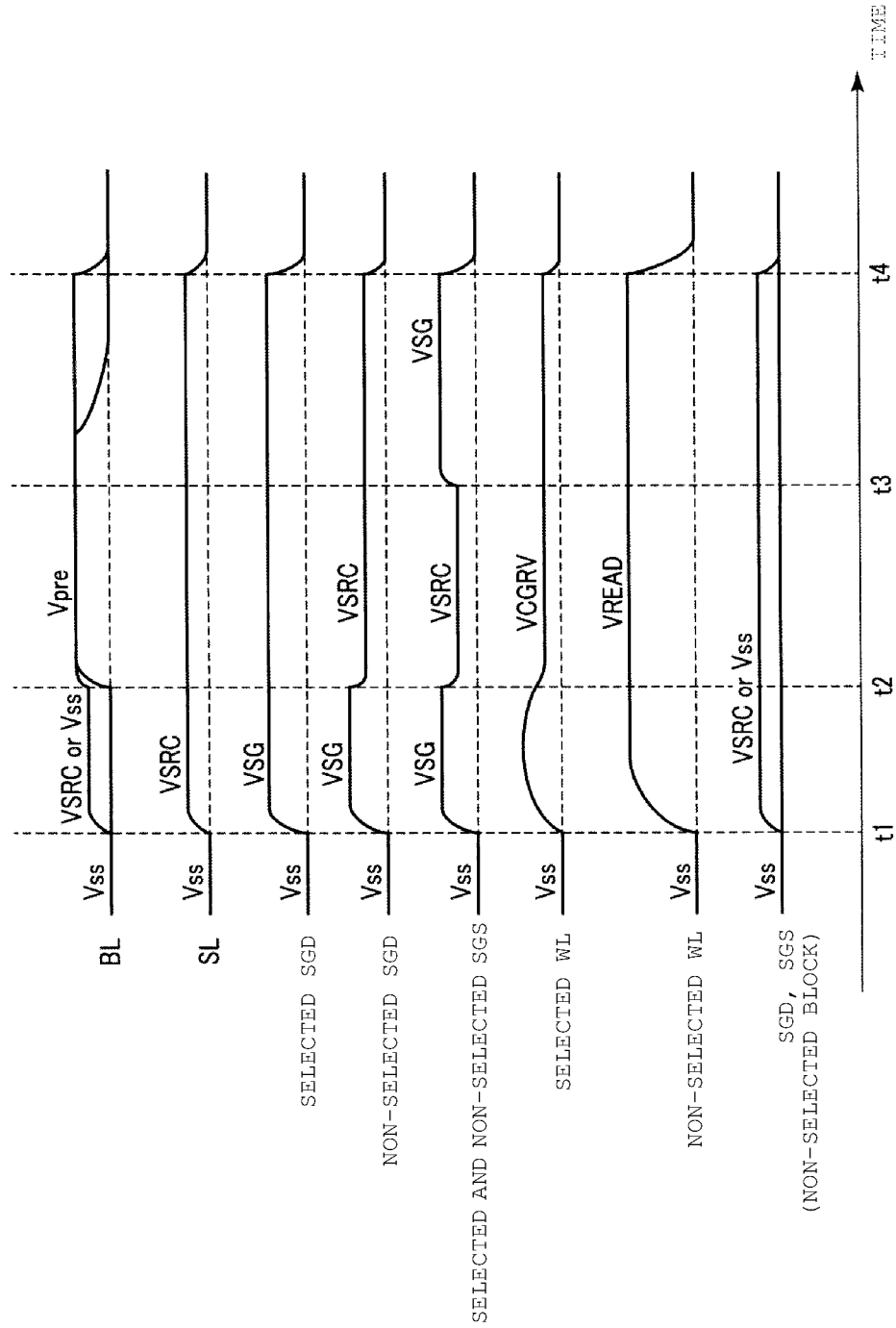

SEMICONDUCTOR MEMORY DEVICE

CROSS-REFERENCE TO RELATED APPLICATIONS

This application is a continuation of U.S. patent application Ser. No. 17/502,573, filed on Oct. 15, 2021, which is a continuation of U.S. patent application Ser. No. 16/883,591, filed on May 26, 2020, now U.S. Pat. No. 11,176,998, granted on Nov. 16, 2021, which is a continuation of U.S. patent application Ser. No. 16/540,529, filed on Aug. 14, 2019, now U.S. Pat. No. 10,706,931, granted on Jul. 7, 2020, which is a continuation of U.S. patent application Ser. No. 15/977,543, filed on May 11, 2018, now U.S. Pat. No. 10,418,104, granted on Sep. 17, 2019, which is a continuation of U.S. patent application Ser. No. 15/498,029, filed on Apr. 26, 2017, now U.S. Pat. No. 10,008,269, granted on Jun. 26, 2018, which is a continuation of U.S. patent application Ser. No. 15/231,715, filed on Aug. 8, 2016, now U.S. Pat. No. 9,666,296, granted on May 30, 2017, which is based upon and claims the benefit of priority from Japanese Patent Application No. 2016-040290, filed on Mar. 2, 2016, the entire contents of each of which are incorporated herein by reference.

FIELD

Embodiments described herein relate generally to a semiconductor memory device.

BACKGROUND

A NAND type flash memory is known as a nonvolatile semiconductor memory device.

DESCRIPTION OF THE DRAWINGS

FIG. 13 is a timing chart illustrating a read operation of the NAND type flash memory according to the first embodiment.

DETAILED DESCRIPTION

In general, according to one embodiment, semiconductor memory device, comprises a memory cell array having a plurality of memory strings disposed in columns, each memory string having a first selection transistor, a second selection transistor, and a plurality of memory cells connected in series between the first and second selection transistors. A plurality of word lines are each connected across memory strings in adjacent columns to a row of memory cells is provided. A plurality of bit lines that are each connected to first select transistors in a column of memory strings is provided. A plurality of first selection gate lines that are each connected across memory strings in adjacent columns to gates of first selection transistors is provided. A plurality of second selection gate lines that are each connected across memory strings in adjacent columns to gates of second selection transistors is provided. A source line that is connected to each of the second select transistors in the memory cell array is provided as is a controller configured to, during a read operation: apply a first voltage to the source line, the first voltage being higher than a ground voltage; apply a second voltage to first and second selection gate lines connected to the selected memory strings, the second voltage being sufficient to turn on the first and second selection transistors; apply the second voltage to each first selection gate lines connected to any non-selected memory strings in plurality of memory strings during a first period of the read operation; and apply a third voltage to each first selection gate lines connected to the non-selected memory strings during a second period of the read operation after the first period, the third voltage being higher than the ground voltage and lower than the second voltage.

Hereinafter, exemplary embodiments will be described with reference to the accompanying drawings.

A semiconductor memory device according to the present disclosure is a nonvolatile semiconductor memory device to which data can be written and rewritten. In the following description, a NAND type flash memory will be discussed as an example of a semiconductor memory device.

1. Configuration of NAND Type Flash Memory

Figure 1:
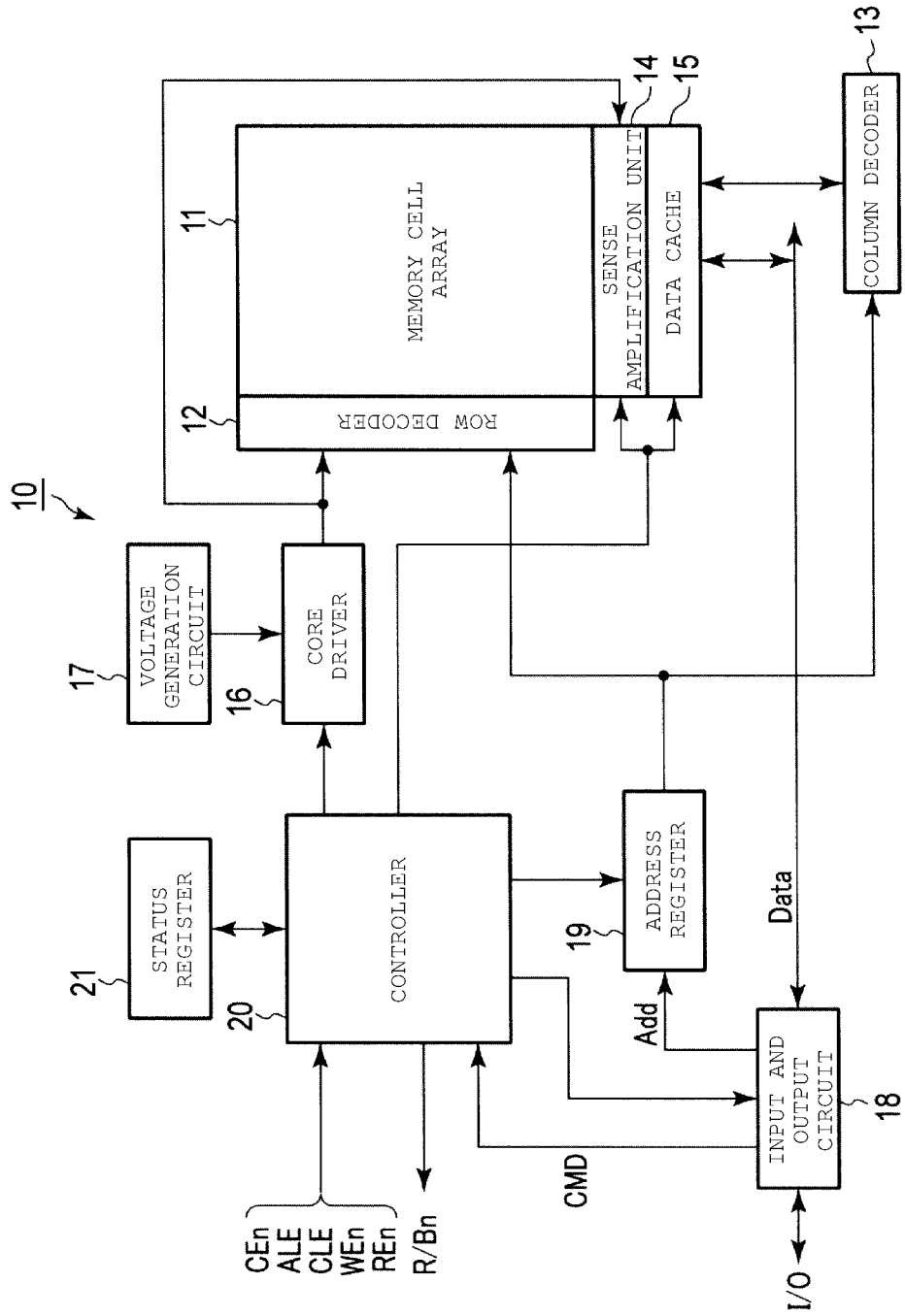
FIG. 1 is a block diagram of a NAND type flash memory according to a first embodiment.

FIG. 1 is a block diagram of a NAND type flash memory 10 according to the first embodiment. The NAND type flash memory 10 includes a memory cell array 11, a row decoder 12, a column decoder 13, a sense amplification unit 14, a data cache (data latch circuit) 15, a core driver 16, a voltage generation circuit 17, an input and output circuit 18, an address register 19, a controller 20, and a status register 21.

The memory cell array 11 includes multiple blocks, and each of the multiple blocks includes multiple memory cell transistors (in some instances these may be simply referred to as "memory cells"). The memory cell transistor includes an EEPROM cell to which data can be electrically rewritten. Multiple bit lines, multiple word lines, and a source line are arranged in the memory cell array 11 so as to control a voltage which is applied to the memory cell transistors. The memory cell array 11 will be described in detail below.

The row decoder 12 receives a block address signal and a row address signal from the address register 19, and selects one word line in a corresponding block based on these address signals. The column decoder 13 receives a column address signal from the address register 19, and selects one bit line based on the column address signal.

When data is read, the sense amplification unit 14 senses and amplifies data which is read from the memory cells on the selected bit line. In addition, the sense amplification unit 14 transmits write data to the bit line, when data is written. Reading and writing data from and to the memory cell array 11 are performed on multiple memory cells as a unit, and this unit is considered a page.

The data cache (buffer) 15 stores data as a page unit. When data is read, the data cache 15 temporarily stores the data which is transmitted from the sense amplification unit 14 on a page basis, and serially transmits the data to the input and output circuit 18. In addition, when data is written, the data cache 15 temporarily stores the data which is serially transmitted from the input and output circuit 18, and transmits the data to the sense amplification unit 14 on a page basis.

The core driver 16 supplies the row decoder 12, the sense amplification unit 14, and a source line driver (not illustrated) with voltages necessary for writing, reading, and erasing of data. The voltages which are supplied by the core driver 16 are applied to the memory cells (specifically, word lines, selection gate lines, bit lines, and source lines) through the row decoder 12, the sense amplification unit 14, and the source line driver.

The voltage generation circuit 17 generates internal voltages (for example, boosted voltages which are generated by raising a power supply voltage) necessary for each operation, and supplies the core driver 16 with the internal voltages.

The controller 20 controls the operations of the NAND type flash memory 10. The controller 20 receives various external control signals, such as a chip enable signal CEn, an address latch enable signal ALE, a command latch enable signal CLE, a write enable signal WEn and a read enable signal REn from an external host device (not illustrated). Here, "n" attached to the signal names indicates active low—that is, the signal has a logical "low" value when it is intended to indicate the corresponding aspect is active/enabled.

The controller 20 identifies an address Add and a command CMD which are supplied from an input and output terminal I/O, based on the external control signals. In addition, the controller 20 transmits the address Add to the column decoder 13 and the row decoder 12 through the address register 19. In addition, the controller 20 decodes the command CMD. The controller 20 performs each sequence of reading, writing, and erasing of data, according to the external control signal and the command CMD. In addition, the controller 20 outputs a ready/busy signal R/Bn to notify the host device of an operation state of the NAND type flash memory 10. The host device can thus know a present state of the NAND type flash memory 10 by receiving the ready/busy signal R/Bn.

The input and output circuit 18 transmits and receives data (including the command CMD, the address Add, and the data) to and from the host device through a NAND bus.

The status register 21 temporarily stores management data which is read from a ROM fuse of the memory cell array 11, when power is turned on, for example. In addition, the status register 21 temporarily stores various data necessary for operation of the memory cell array 11. The status register 21 includes, for example, an SRAM.

1-1. Configuration of Memory Cell Array 11

Figure 2:
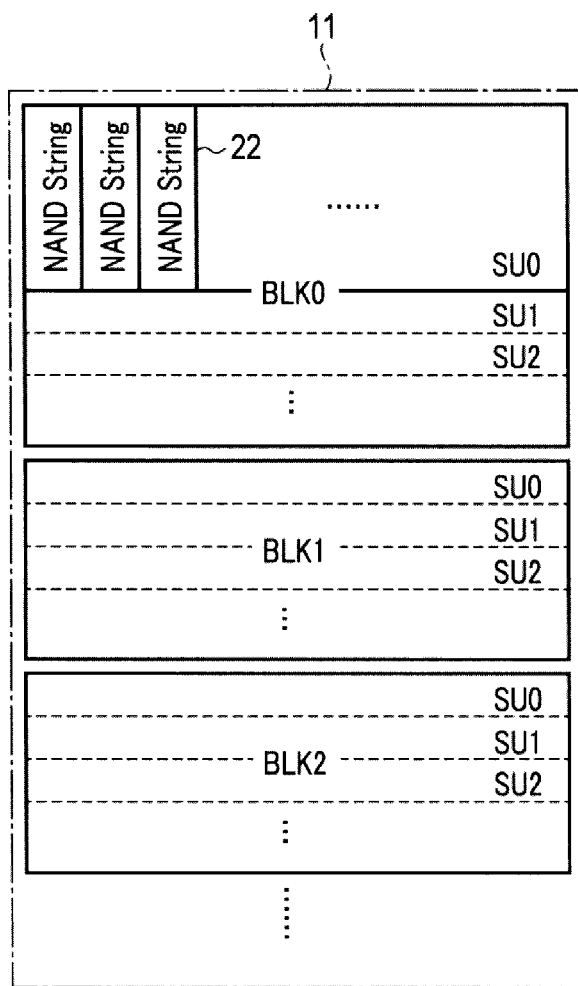
FIG. 2 is a block diagram of a memory cell array.

FIG. 2 is a block diagram of the memory cell array 11. The memory cell array 11 includes multiple blocks BLK (BLK0, BLK1, BLK2, etc.). Each of the multiple blocks BLK includes multiple string units SU (SU0, SU1, SU2, etc.). Each of the multiple string units SU includes multiple NAND strings 22. The number of blocks in the memory cell array 11, the number of string units in one block BLK, and the number of NAND strings in one string unit SU, can be arbitrarily set.

Figure 3:
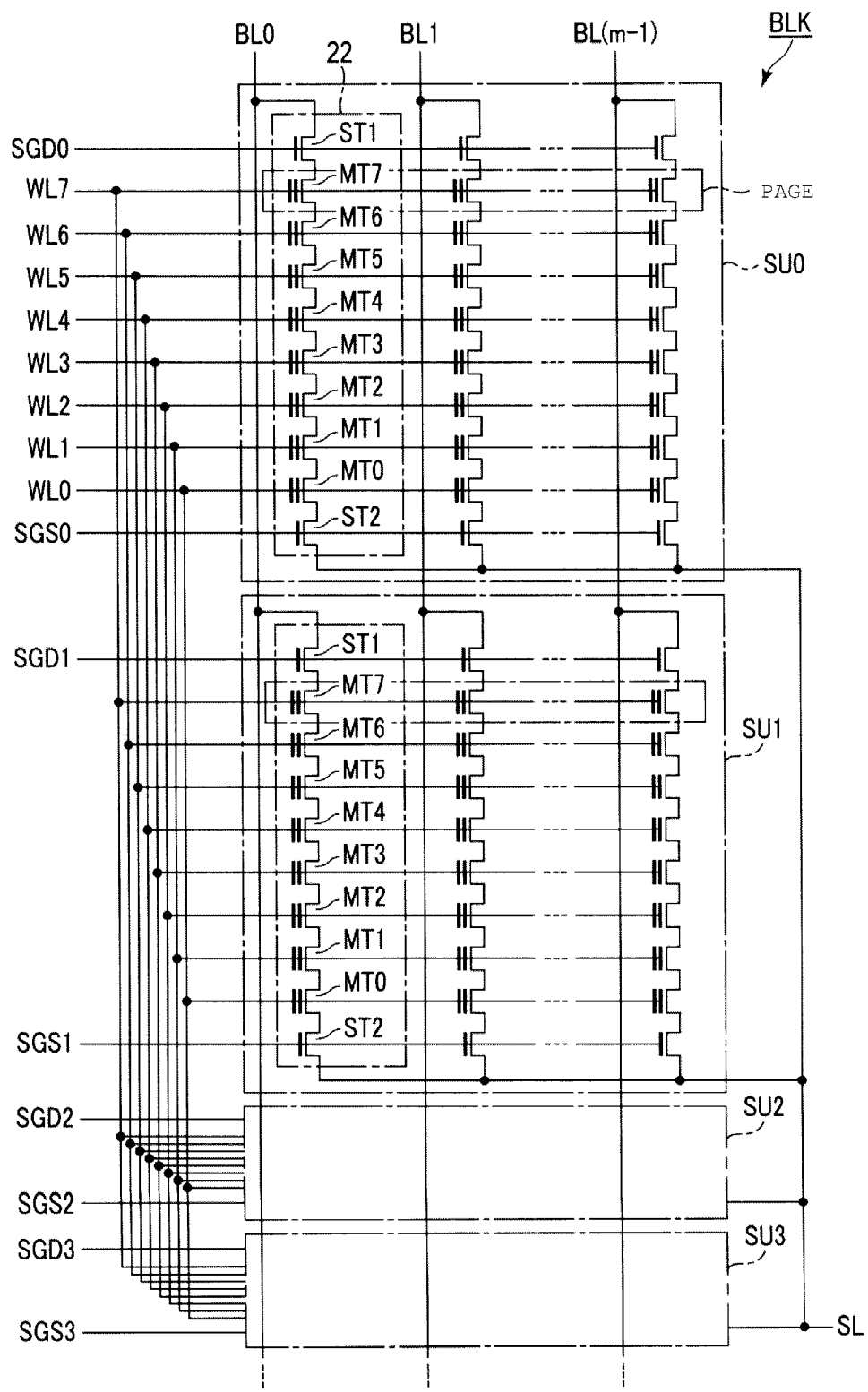
FIG. 3 is a circuit diagram of a block which is included in the memory cell array.

FIG. 3 is a circuit diagram of one block BLK which is included in the memory cell array 11. Each of the multiple NAND strings 22 includes multiple memory cell transistors MT, and two selection transistors ST1 and ST2. In the present disclosure, the memory cell transistor may also be referred to as "a memory cell" or "a cell." FIG. 3 illustrates a configuration example in which the NAND string 22 includes eight memory cell transistors MT (MT0 to MT7), but the number of the memory cell transistors MT included in the NAND string 22 can be arbitrarily set. The memory cell transistor MT includes a control gate and a gate stack including a charge storage layer, and stores data in a nonvolatile manner. The memory cell transistor MT may be configured to store one bit data (two values), and may be configured to store data (or three values or more) more than two bits.

The multiple memory cell transistors MT are arranged between the selection transistors ST1 and ST2 such that a current path is connected in series. A current path of the memory cell transistor MT on one end of the series connection is connected to one end of a current path of the selection transistor ST1, and a current path of the memory cell transistor MT on the other end of the series connection is connected to one end of a current path of the selection transistor ST2.

Gates of the multiple selection transistors ST1 included in the string units SU0 are connected in common to a selection gate line SGD0, and in the same manner, the string units SU1 to SU3 are respectively connected to selection gate lines SGD1 to SGD3. Gates of the multiple selection transistors ST2 included in the string units SU0 are connected in common to a selection gate line SGS0, and in the same manner, the string units SU1 to SU3 are respectively connected to selection gate lines SGS1 to SGS3. Gates of the multiple selection transistors ST2 in the same block BLK may be connected in common to the same selection gate line SGS. Control gates of the memory cell transistors MT0 to MT7 in the same block BLK are respectively connected to word lines WL0 to WL7.

The other ends of current paths of the selection transistors ST1 of the multiple NAND strings 22 in the same column, among the NAND strings 22 which are arranged in a matrix in the memory cell array 11, are connected in common to one of the bit lines BL0 to BL(m−1). Here, "m" is an integer equal to or greater than "1". That is, one bit line BL is connected to the NAND strings 22 in the same column in the multiple blocks BLK. The other ends of current paths of the multiple selection transistors ST2 which are included in the same block BLK are connected in common to a source line SL. The source line SL is connected in common to the multiple NAND strings 22 in, for example, the multiple blocks.

Data of the multiple memory cell transistors MT in the same block BLK may be collectively erased. Reading and writing of data are simultaneously performed with respect to the multiple memory cell transistors MT which are connected in common to one word line WL that is arranged in one block BLK. This data unit is called a page.

Figure 4:
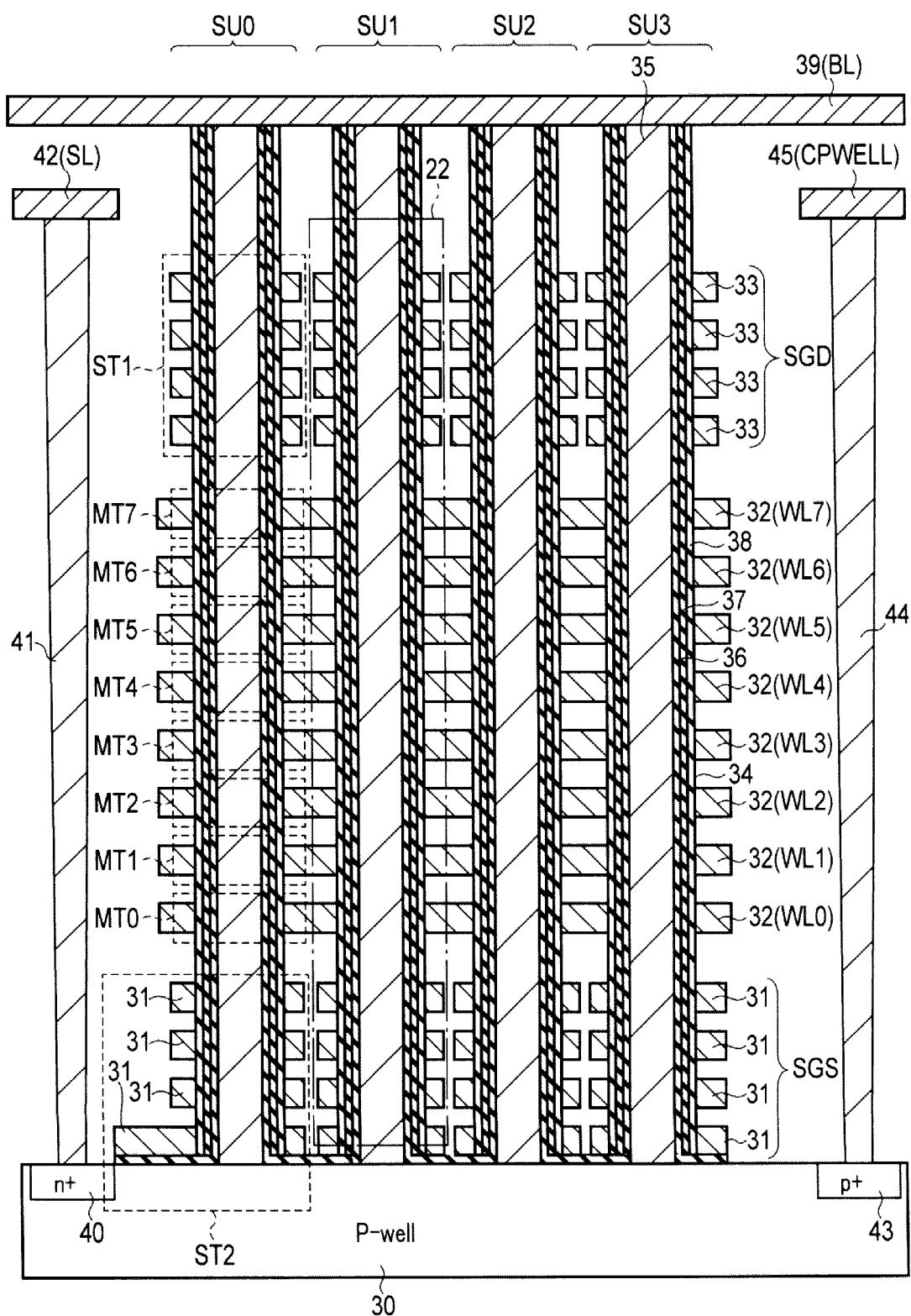
FIG. 4 is a cross-sectional view of a region of the block.

FIG. 4 is a cross-sectional view of a part of the block BLK. The multiple NAND strings 22 are formed on a P-type well region 30. That is, a wiring layer 31 of, for example, four layers (which functions as the selection gate line SGS), a wiring layer 32 of eight layers (which functions as the word lines WL0 to WL7), and a wiring layer 33 of four layers (which functions as the selection gate line SGD) are sequentially stacked on the P-type well region 30. Insulating films (not specifically illustrated) are formed between the stacked wiring layers.

In addition, memory holes 34 extending to the well region 30 by penetrating through the wiring layers 31, 32, and 33 are formed. A semiconductor layer 35 of a pillar shape is formed in the memory hole 34. A gate insulating film 36, a charge storage layer (insulating film) 37, and a block insulating film 38 are sequentially formed on a side surface of the semiconductor layer 35. The memory cell transistors MT and the selection transistors ST1 and ST2 are formed with these films and layers. The semiconductor layers 35 function as the current paths of the NAND strings 22, and are regions in which channels of each transistor are formed. An upper end of the semiconductor layer 35 is connected to a metal wiring layer 39 which functions as the bit line BL.

An nt-type impurity diffusion layer 40 is formed in a surface region of the well region 30. A contact plug 41 is formed on the diffusion layer 40. The contact plug 41 is connected to a metal wiring layer 42 which functions as the source line SL. Furthermore, a pt-type impurity diffusion layer 43 is formed in a surface region of the well region 30. A contact plug 44 is formed on the diffusion layer 43, and the contact plug 44 is connected to a metal wiring layer 45 which functions as a well wire CPWELL. The well wire CPWELL is used for applying a potential to the semiconductor layer 35 through the well region 30.

The above configuration can be repeatedly arranged along a depth direction in to and out of the page on which FIG. 4 is illustrated, and the string units SU are formed by the multiple NAND strings 22 which are disposed along the depth direction.

Figure 5:
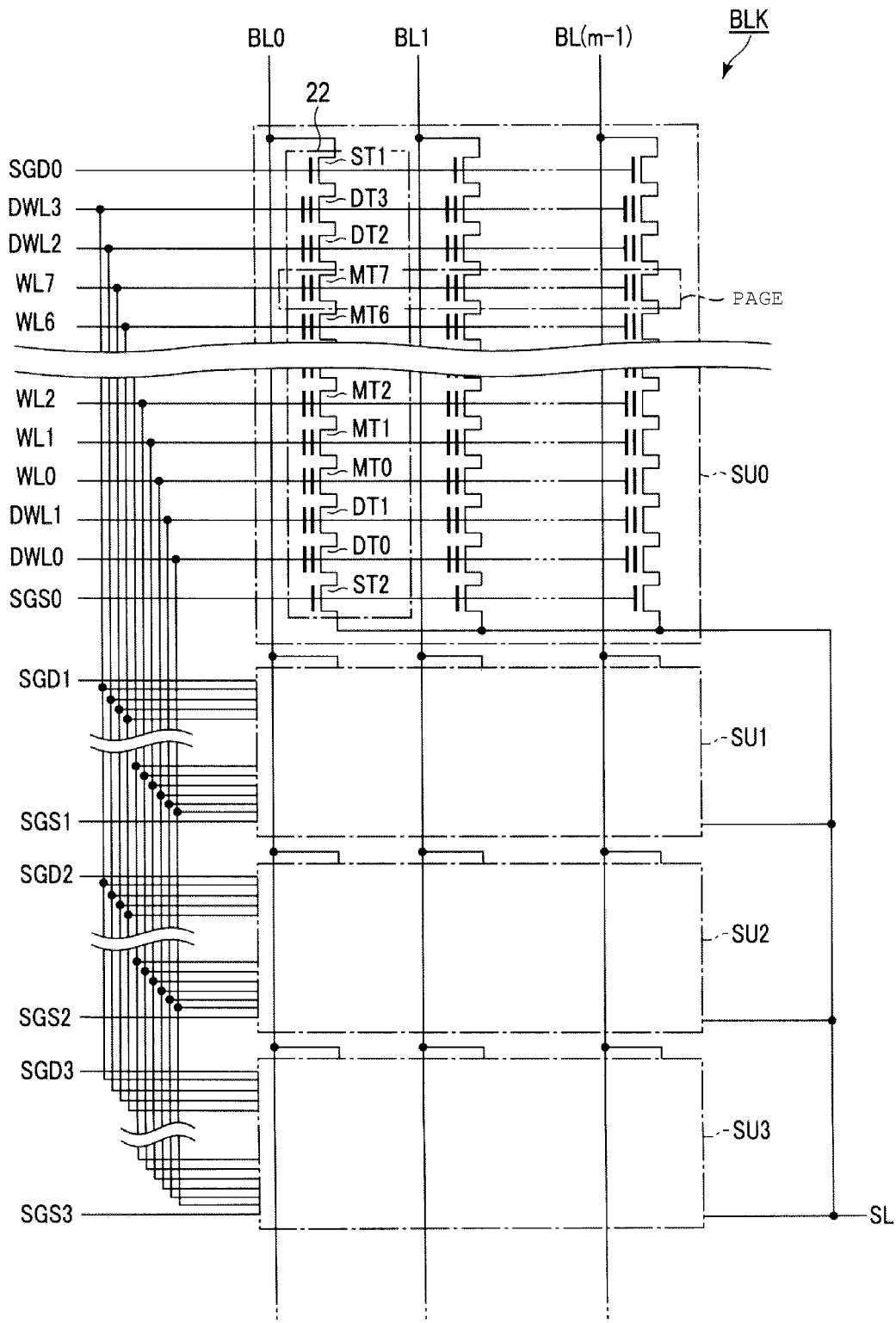
FIG. 5 is a circuit diagram illustrating dummy cell transistors.

The NAND string 22 may include dummy cell transistors. FIG. 5 is a circuit diagram illustrating the dummy cell transistors.

For example, two dummy cell transistors DT0 and DT1 are connected in series between the selection transistor ST2 and the memory cell transistor MT0. For example, two dummy cell transistors DT2 and DT3 are connected in series between the memory cell transistor MT7 and the selection transistor ST1. Dummy word lines DWL0 to DWL3 are respectively connected to gates of the dummy cell transistors DT0 to DT3. A configuration of the dummy cell transistor is the same as that of the memory cell transistor. The dummy cell transistor is not used for storing data, and has a function of reducing read disturbances occurring in the memory cell transistor or the selection transistor, during a write pulse application operation or an erasure pulse application operation.

A configuration of the memory cell array is described in, for example, U.S. patent application Ser. No. 12/407,403 filed on Mar. 19, 2009 and entitled "THREE DIMENSIONAL STACKED NONVOLATILE SEMICONDUCTOR MEMORY". In addition, the configuration is described in U.S. patent application Ser. No. 12/406,524 filed on Mar. 18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND METHOD FOR MANUFACTURING SAME". All the patent applications are employed in the present disclosure by reference.

In addition, erasing of data can be performed by a block BLK unit or a unit smaller than the block BLK. An erasing method is described in, for example, U.S. patent application Ser. No. 13/235,389 filed on Sep. 18, 2011 and entitled "NONVOLATILE SEMICONDUCTOR MEMORY DEVICE", U.S. patent application Ser. No. 12/694,690 filed on Jan. 27, 2010 and entitled "NON-VOLATILE SEMICONDUCTOR STORAGE DEVICE", and U.S. patent application Ser. No. 13/483,610 filed on May 30, 2012 and entitled "NONVOLATILE SEMICONDUCTOR MEMORY DEVICE AND DATA ERASE METHOD THEREOF". All the patent applications are employed in the present disclosure by reference.

1-2. Configurations of Sense Amplification Unit 14 and Data Cache 15

Figure 6:
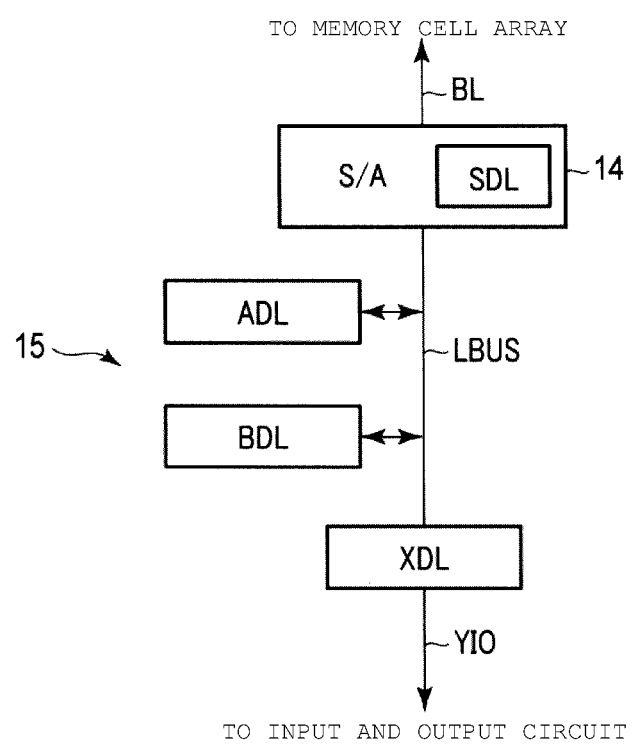
FIG. 6 is a block diagram of a sense amplification unit and a data cache.

FIG. 6 is a block diagram of the sense amplification unit 14 and the data cache 15.

The data cache 15 includes, for example, three caches ADL, BDL, and XDL. The number of caches included in the data cache 15 can be appropriately set according to the number of bits which are stored in one memory cell.

The caches ADL, BDL, and XDL can temporarily store data. The cache XDL is arranged in the location closest to an IO pad (circuit), and is connected to the input and output circuit 18 through a bidirectional bus YIO. The cache XDL is connected to the sense amplification unit 14 and also the caches ADL and BDL through an internal bus LBUS. Write data or the like stored in the cache XDL can be copied and transmitted to the caches ADL and BDL through the internal bus LBUS. The cache XDL is not limited with respect to physical locations of the caches ADL and BDL, and may be arranged accordingly.

The sense amplification unit (S/A) 14 includes a cache (sense amplification cache) SDL for storing read results, when reading data. Read data or the like stored in the cache SDL can be copied and transmitted to the caches ADL and BDL through the internal bus LBUS.

The sense amplification unit 14 is connected to the memory cell through the bit line BL, and has a capacity corresponding only to the number of units (for example, 32 kilobytes) which can be simultaneously read. Specifically, in this example, when 32 kilobytes can be simultaneously read, the bit lines BL are available for 32768 bytes (that is, 262144 bits), and the caches SDL, ADL, BDL, and XDL are also provided in the same storage capacity as those values.

1-3. Specific Configuration of Sense Amplification Unit 14

Figure 7:
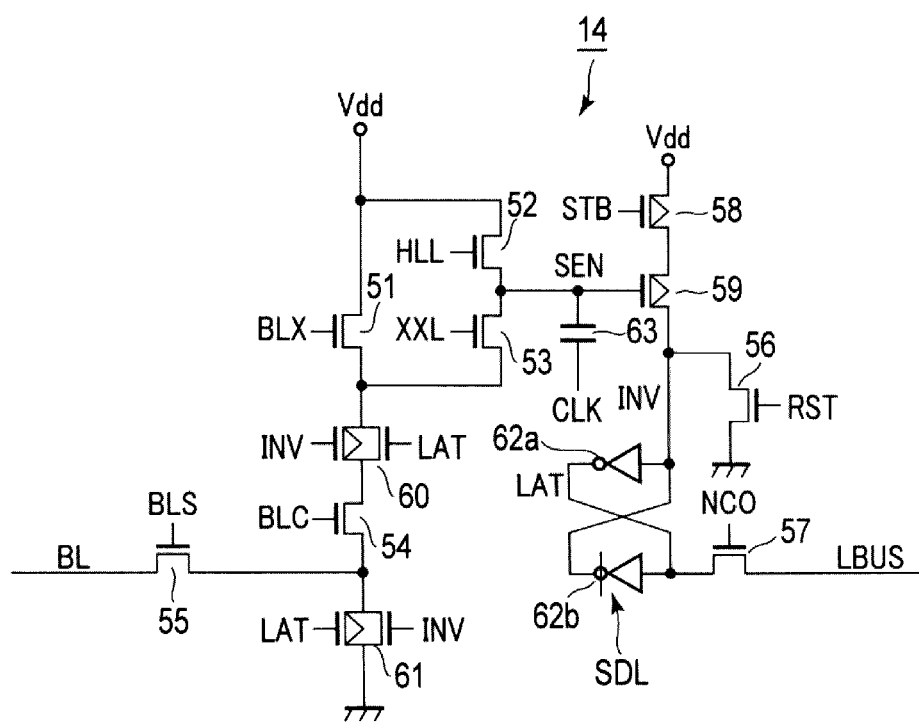
FIG. 7 is a circuit diagram of the sense amplification unit.

FIG. 7 is a circuit diagram of the sense amplification unit 14.

The sense amplification unit 14 includes multiple N channel MOS transistors (hereinafter, referred to as NMOS) 51 to 57, multiple P channel MOS transistors (hereinafter, referred to as PMOS) 58 and 59, the transfer gates 60 and 61, the cache (data latch circuit) SDL, and a capacitor 63. The cache SDL includes, for example, clocked inverter circuits 62a and 62b.

One end of a current path of the NMOS 51 is connected to a node to which a power supply voltage Vdd is supplied. The other end of the current path of the NMOS 51 is grounded through the transfer gate 60, the NMOS 54, and transfer gate 61 ("grounded" here means connected to a node to which a voltage Vss is supplied, the voltage Vss may be, for example, a ground voltage (0 V)). One end of a current path of the NMOS 55 is connected to a connection node between the NMOS 54 and the transfer gate 61. The other end of the NMOS 55 is connected to the bit line BL which is arranged in the memory cell array 11. The NMOS 51 is connected in parallel to a series circuit of the NMOS 52 and the NMOS 53.

One end of a current path of the PMOS 58 is connected to a node to which the power supply voltage Vdd is supplied. The other end of a current path of the PMOS 58 is connected to an input terminal of the inverter circuit 62a which configures the cache SDL through the PMOS 59, and is grounded through the NMOS 56. An input terminal of the clocked inverter circuit 62b, which is cross-coupled to the inverter circuit 62a, is connected to the internal bus LBUS through the NMOS 57. A gate of the PMOS 59 is connected to a connection node between the NMOS 52 and the NMOS 53, and one terminal of the capacitor 63 through a sense node SEN. A clock signal CLK is supplied to the other terminal of the capacitor 63.

The controller 20 supplies the sense amplification unit 14 with various control signals (for example, signals BLX, BLC, BLS, HLL, XXL, STB, RST, and NCO) as further described below.

The signal BLX is supplied to a gate of the NMOS 51. A signal LAT of an output terminal of the inverter circuit 62a, which configures the cache SDL, is supplied to a gate of the NMOS transistor in the transfer gate 60. A signal INV of an input terminal of the inverter circuit 62a is supplied to a gate of the PMOS transistor in the transfer gate 60. The signal BLC is supplied to a gate of the NMOS 54. The signal BLS is supplied to a gate of the NMOS 55.

The signal INV is also supplied to a gate of the NMOS transistor in the transfer gate 61. The signal LAT is also supplied to a gate of the PMOS transistor in the transfer gate 61.

The signal HLL is supplied to a gate of the NMOS 52. The signal XXL is supplied to a gate of the NMOS 53. The signal STB is supplied to a gate of the PMOS 58. The reset signal RST is supplied to a gate of the NMOS 56. The signal NCO is supplied to a gate of the NMOS 57.

Next, a write operation, a read operation, and a write verification operation of the sense amplification unit 14 will be schematically described.

(Write Operation)

When data is written to the memory cell, the controller 20 generates the control signals as follows. First, the controller 20 sets the signal STB go to a high level (hereinafter, referred to as an "H" level), sets the reset signal RST to an "H" level once, and resets the cache SDL. Thereby, the signal LAT of the cache SDL becomes an "H" level, and the signal INV becomes a low level (hereinafter, referred to as an "L" level).

Thereafter, the controller 20 sets the signal NCO to an "H" level. Data is taken into the cache SDL from the internal bus LBUS. When the data is in an "L" level ("0") indicating write, the signal LAT becomes an "L" level, and the signal INV becomes an "H" level. In addition, when the data is in an "H" level ("1") indicating non-write, data of the cache SDL does not change, and the signal LAT is maintained as the signal LAT is in an "H" level and the signal INV is in an "L" level.

Subsequently, the controller 20 makes the signals BLX, BLC, and BLS go to an "H" level. Then, in a case of write (that is, when the signal LAT of the cache SDL is in an "L" level and the signal INV is in an "H" level), the transfer gate 60 is turned off and the transfer gate 61 is turned on, whereby a voltage of the bit line BL becomes the voltage Vss. In this state, when a voltage of the word line becomes the program voltage Vpgm, data is written to the memory cell.

Meanwhile, in a case of non-write (that is, when the signal LAT of the cache SDL is in an "H" level and the signal INV is in an "L" level), the transfer gate 60 is turned on and the transfer gate 61 is turned off, whereby the bit line BL is electrically charged with the power supply voltage Vdd. Here, when the voltage of the word line is the program voltage Vpgm, a channel of the memory cell is raised to a high voltage, and thus the data is not written to the memory cell.

Read Operation and Write Verification Operation

When data is read from the memory cell, the controller 20 generates the control signals as follows. First, the controller 20 makes the reset signal RST once go to an "H" level and resets the cache SDL. Thereby, the signal LAT of the cache SDL goes to an "H" level, and the signal INV goes to a low level.

Thereafter, the controller 20 sets the signal BLS, BLC, BLX, HLL, and XXL to a predetermined voltage. Thereby, the bit line BL is electrically charged and the node SEN of the capacitor 63 is electrically charged with the power supply voltage Vdd. Here, when a threshold voltage of the memory cell is higher than a read level, the memory cell is turned off, and the bit line BL is maintained in an "H" level. That is, the node SEN is maintained in an "H" level. In addition, when the threshold voltage of the memory cell is lower than the read level, the memory cell is turned on, and electric charges of the bit line BL are discharged. Accordingly, the voltage of the bit line BL goes to an "L" level. Thereby, the node SEN also goes to an "L" level.

Subsequently, the controller 20 makes the signal STB go to an "L" level. Then, when the memory cell is turned on, the node SEN goes to an "L" level, and thus, the PMOS 59 is turned on. Thereby, the signal INV of the cache SDL goes to an "H" level and the signal LAT goes to an "L" level. Meanwhile, when the memory cell is turned off, the node SEN goes to an "H" level, and thus, the PMOS 59 is turned off. Thereby, the signal INV of the cache SDL goes to an "L" level and the signal LAT goes to an "H" level.

Thereafter, the controller 20 sets the signal NCO to an "H" level. Then, the NMOS 57 is turned on and the data of the cache SDL is transmitted to the internal bus LBUS.

In addition, after the write operation, a write verification operation of verifying the threshold voltage of the memory cell is performed. The write verification operation is performed in the same manner as the read operation.

1-4. Configuration of Row Decoder 12

Figure 8:
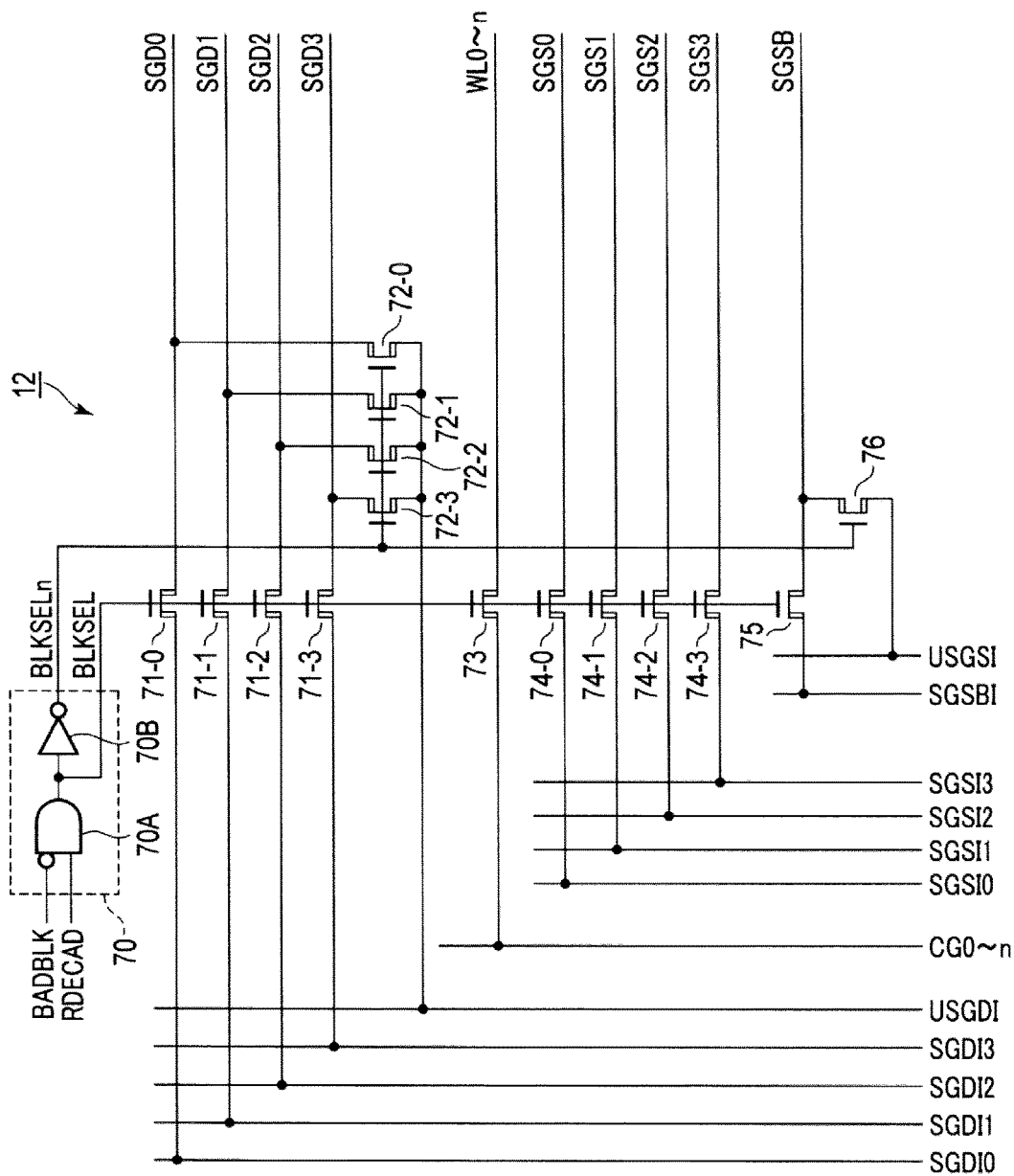
FIG. 8 is a circuit diagram of a row decoder.

Next, a configuration of the row decoder 12 will be described. FIG. 8 is a circuit diagram of the row decoder 12. The row decoder 12 includes a block decoder 70 and multiple transfer gates (e.g., 71 to 75).

The block decoder 70 includes a NAND gate 70A and an inverter circuit 70B. A first input terminal (active high) of the NAND gate 70A receives a signal RDECAD, and a second input terminal (active low) of the NAND gate 70A receives a signal BADBLK.

The signal RDECAD goes to an "H" level when a corresponding block is a selected block, and goes to a "L" level when the corresponding block is a non-selected block. The signal BADBLK goes to an "H" level when the corresponding block is a failed block (bad block).

The NAND gate 70A outputs a signal BLKSEL. An output terminal of the NAND gate 70A is connected to an input terminal of the inverter circuit 70B. The inverter circuit 70B outputs a signal BLKSELn.

The row decoder 12 includes transfer gates 71 (71-0 to 71-3), 72 (72-0 to 72-3), 73, 74 (74-0 to 74-3), 75, and 76. Each of the transfer gates includes an N channel MOS transistor of a high breakdown voltage.

The MOS transistors 71 and 72 transmit voltages to the selection gate lines SGD. One terminal of a current path of each of the MOS transistors 71-0 to 71-3 is connected to each of the selection gate lines SGD0 to SGD3, the other terminal of each of the MOS transistors is connected to each of the signal lines SGDI0 to SGDI3, and the signal BLKSEL is supplied in common to gates of the MOS transistors.

One terminal of the current path of each of the MOS transistors 72-0 to 72-3 is connected to each of the selection gate lines SGD0 to SGD3, the other terminal of each of the MOS transistors is connected in common to the signal line USGDI, and the signal BLKSELn is supplied in common to gates of the MOS transistors.

The MOS transistors 73 transmit voltages to the word lines WL. One terminal of a current path of each of the MOS transistors 72 is connected to a corresponding word line WL, the other terminals thereof are connected to corresponding signal lines CG, and the signal BLKSEL is supplied to gates of the MOS transistors. FIG. 8 illustrates only one MOS transistor 73, but the MOS transistors 73 are provided by the number of the word lines WL.

The MOS transistors 74 transmit voltages to selection gate lines SGS. One terminal of a current path of each of the MOS transistors 74-0 to 74-3 is connected to the selection gate lines SGS0 to SGS3, the other terminals thereof are respectively connected to signal lines SGSI0 to SGSI3, and the signal BLKSEL is supplied in common to gates thereof.

The MOS transistors 75 and 76 transmit voltages to a selection gate line SGSB. While not being illustrated in FIG. 3, the selection gate line SGSB (and selection transistors connected to this) is arranged on a lowermost layer of the NAND string 22, reduces resistance on a source side of the NAND string 22, and transmits a predetermined voltage to a non-selected block.

The MOS transistor 75 has one terminal of a current path connected to the selection gate line SGSB, the other terminal connected to a signal line SGSBI, and a gate receiving the signal BLKSEL. The MOS transistor 76 has one terminal of a current path connected to the selection gate line SGSB, the other terminal connected to a signal line USGSI, and a gate receiving the signal BLKSELn.

The selection gate line SGSB is connected to a lowermost selection transistor among the multiple selection transistors on the source side. The selection gate line SGSB (and selection transistors connected to this) has a function of reducing resistance of the NAND string 22 (specifically, the semiconductor layer 35 of a pillar shape). In the selected block, the selection transistor connected to the selection gate line SGSB is turned on. Voltage setting of the NAND string 22 which is in the write operation, the read operation, and the erasure operation, is performed by using the selection gate lines SGS.

The signal lines SGDI0 to SGDI3, USGDI, CG, SGSI0 TO SGSI3, SGSBI, and USGSI are connected to the core driver 16.

2. Operation of NAND Type Flash Memory 10

Figure 9:
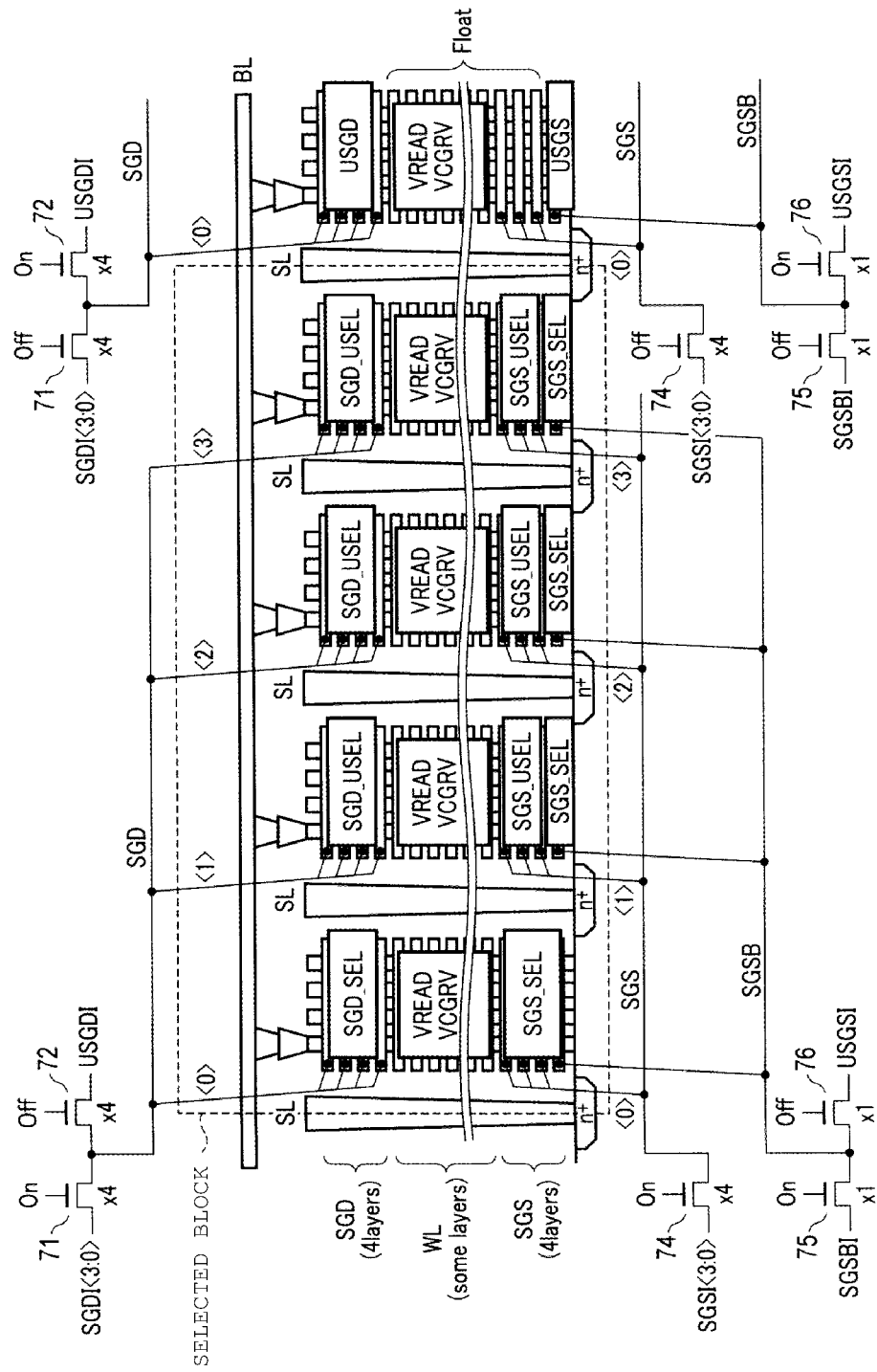
FIG. 9 is a schematic diagram illustrating a block selection operation.

First, a block selecting operation will be described. FIG. 9 is a schematic diagram illustrating a block selecting operation.

In the selected block, the MOS transistors 71, 73, 74, and 75 are turned on, and the MOS transistors 72 and 76 are turned off. Hence, in the selected block, the selection gate lines SGD are connected to the signal lines SGDI, the selection gate lines SGS are connected to the signal lines SGSI, the selection gate line SGSB is connected to the signal line SGSBI, and the word lines WL are connected to the signal lines CG.

Furthermore, the three-dimensional stacked NAND type flash memory 10 can select one string unit in the selected block. As illustrated in FIG. 9, as an example, when only the string units SU0 in the selected block are selected, the core driver 16 applies a voltage SGD_SEL to the selection gate line SGD0 so as to turn on the selection transistor ST1, and applies a voltage SGS_SEL to the selection gate lines SGS0 and SGSB so as to turn on the selection transistor ST2. In addition, the core driver 16 applies a voltage SGD_USEL to the selection gate lines SGD1 to SGD3 so as to turn off the selection transistor ST1, and applies a voltage SGS_USEL to the selection gate lines SGS1 to SGS3 so as to turn off the selection transistor ST2. A voltage VREAD or a voltage VCGRV which will be described below is applied to the word line WL.

Meanwhile, in the non-selected blocks, the MOS transistors 71, 73, 74, and 75 are turned off, and the MOS transistors 72 and 76 are turned on. Hence, in the non-selected block, the selection gate lines SGD is connected to the signal line USGDI, and the selection gate line SGSB is connected to the signal line USGSI. The word line WL and the selection gate lines SGS enter a floating state. The core driver 16 applies the voltage USGD to the selection gate lines SGD0 to SGD3 so as to turn off the selection transistor ST1, and applies the voltage USGS to the selection gate line SGSB so as to turn off the selection transistor ST2.

As described above, the selection gate lines SGS which are connected to the multiple selection transistors ST2 in the same block BLK may be common. In this case, the selection gate lines SGS<3:0> are wired as a common selection gate lines SGS.

In this manner, the three-dimensional stacked NAND type flash memory includes selected NAND strings and non-selected NAND strings in the selected block. For this reason, unique read disturbances, which does not occur in a two-dimensional (planar) NAND type flash memory, occurs. The present embodiment is intended to prevent or limit the read disturbance caused by hot carriers which are injected into a memory cell (or dummy cell) adjacent to the selection gate lines SGD in the non-selected NAND strings.

Hereinafter, the read operations will be separately described by using an all-bit-line (ABL) method and a bit line shield method. The ABL method is a method of simultaneously reading data from all bit lines. The bit line shield method is a method of independently reading data from the even-numbered bit lines and the odd-numbered bit lines. The bit lines which are not read targets in the bit line shield method are set to the voltage Vss and function as shield lines.

2-1. Operation of ABL Method

Figure 10:
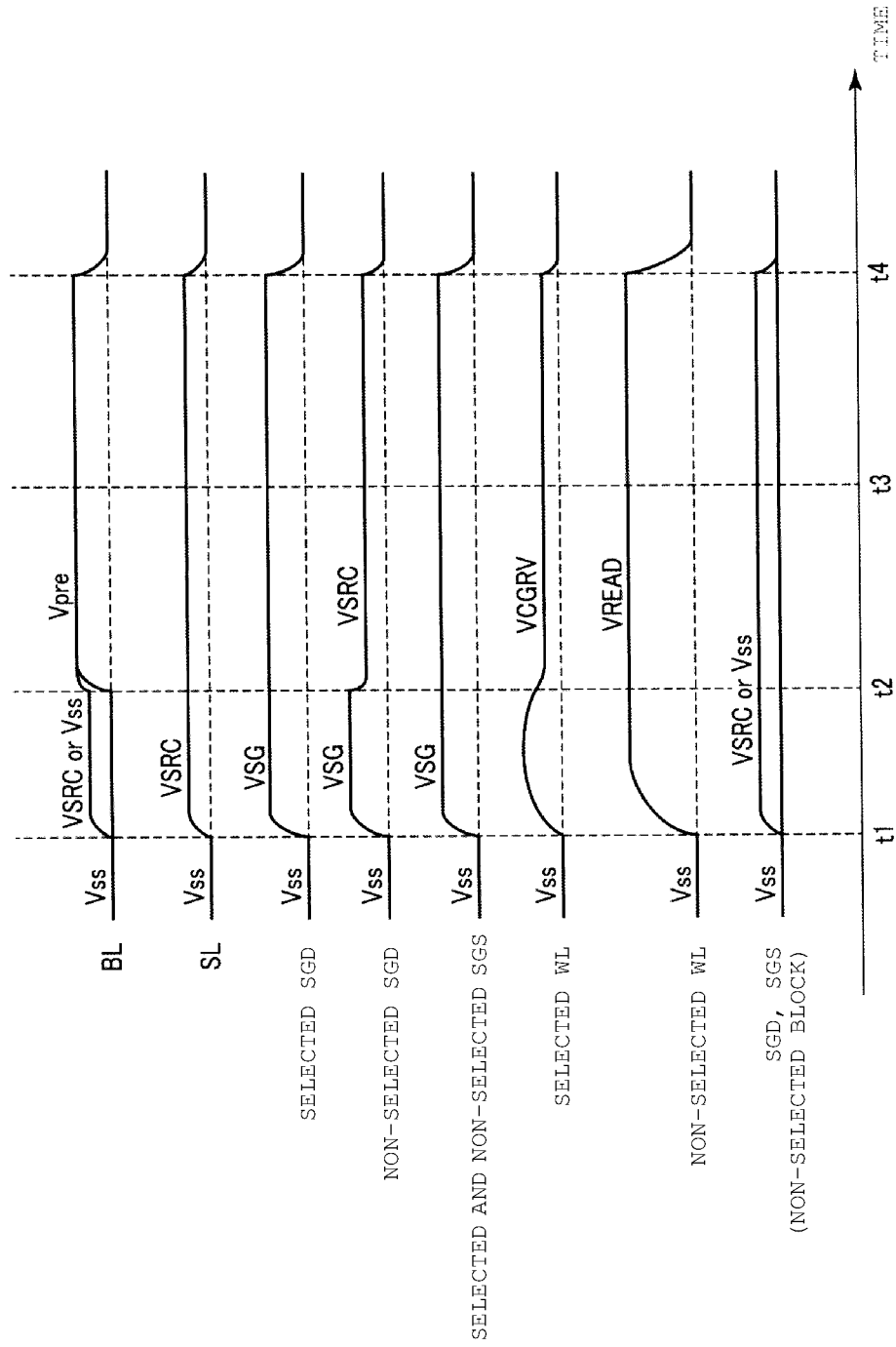
FIG. 10 is a timing chart illustrating a read operation of the NAND type flash memory according to the first embodiment.

FIG. 10 is a timing chart illustrating a read operation of the NAND type flash memory 10 according to the ABL method. In FIG. 10, a period between points of time t1 and t2 is a read preparation period for reducing a raised channel voltage, a period between points of time t2 and t3 is a precharge period, and a period between points of time t3 and t4 is a read period for determining data of the memory cell.

At the point of time t1, the controller 20 applies the voltage Vss (e.g., 0 V) or a voltage VSRC to the bit line BL, and applies the voltage VSRC to the source line. The voltage VSRC is has a value according to the following relationship: Vss<VSRC<Vdd. The controller 20 applies a read voltage VCGRV to the selected word lines WL, and applies a read pass voltage VREAD to non-selected word lines WL. The read voltage VCGRV is a threshold voltage of the memory cell of a read target, that is, a voltage for determining data of the memory cell. The read pass voltage VREAD turns on the memory cell regardless of data stored in the memory cell. In FIG. 10, a voltage of the selected word line WL temporarily becomes higher than the read voltage VCGRV by coupling of the selected word line WL and the non-selected word line WL.

In addition, the controller 20 applies a voltage VSG to selected SGD (selected selection gate lines SGD), non-selected SGD (non-selected selection gate lines SGD), selected SGS (selected selection gate lines SGS), non-selected SGS (non-selected selection gate lines SGS). The voltage VSG turns on the selection transistors ST1 and ST2, and is, for example, approximately 6 V. That is, in the present embodiment, the selection transistors ST1 are turned on in the non-selected NAND strings.

In the non-selected NAND strings of the selected block, when the selection transistor ST1 is in an off state when the memory cell connected to the selected word line WL is in a cut-off state, a channel of a drain side is raised when voltages of the non-selected word lines WL are raised to the read pass voltage VREAD, and the threshold voltage of the memory cell adjacent to the selected word line WL is increased by read disturbance caused by injected hot carriers. Hence, to decrease a voltage of the raised channel, the selection transistor ST1 of the non-selected NAND strings is turned on when the voltages of the non-selected word lines WL are increased to the read pass voltage VREAD. Accordingly, it is possible to prevent the read disturbance, caused by the hot carriers which are injected into the memory cell adjacent to the selected word line WL, from occurring.

In the non-selected blocks, the voltage Vss or the voltage VSRC is applied to the selection gate lines SGD and SGS.

Subsequently, at the point of time t2, the controller 20 applies a precharge voltage Vpre to the bit line BL. The precharge voltage Vpre precharges the bit line BL before data is read from the memory cell, and is, for example, approximately VSRC+0.5 V.

Subsequently, the controller 20 applies the voltage VSRC to the non-selected SGD. Thereby, the selection transistors ST1 in the non-selected NAND strings are turned off. In this case, the non-selected SGD is set as the voltage VSRC at the same time as the source line SL, and thus, the selection transistors ST1 are turned off and a voltage difference between the adjacent word lines can be reduced.

The voltage which is applied to the non-selected SGD at the point of time t2 is not limited to the voltage VSRC in the same manner as the source line, and may be a voltage which turns off the selection transistor ST1. That is, the voltage which is applied to the non-selected SGD at time t2 is higher than the voltage Vss, and may be equal to or lower than a voltage which is obtained by adding the threshold voltage of the selection transistor ST1 to the voltage VSRC of the source line.

Subsequently, at the point of time t3, the sense amplification unit 14 determines a current of the bit line thereby reading the data of the memory cell. Thereafter, at the point of time t4, voltages of various wires are reset.

During the period between the points of time t1 and t2, all the bit lines BL may enter a floating state. Even in this case, the same operation as above can be performed, and power consumption can be reduced, as compared to a case where the aforementioned bit line BL is set as the voltage VSRC.

COMPARATIVE EXAMPLE

Figure 11:
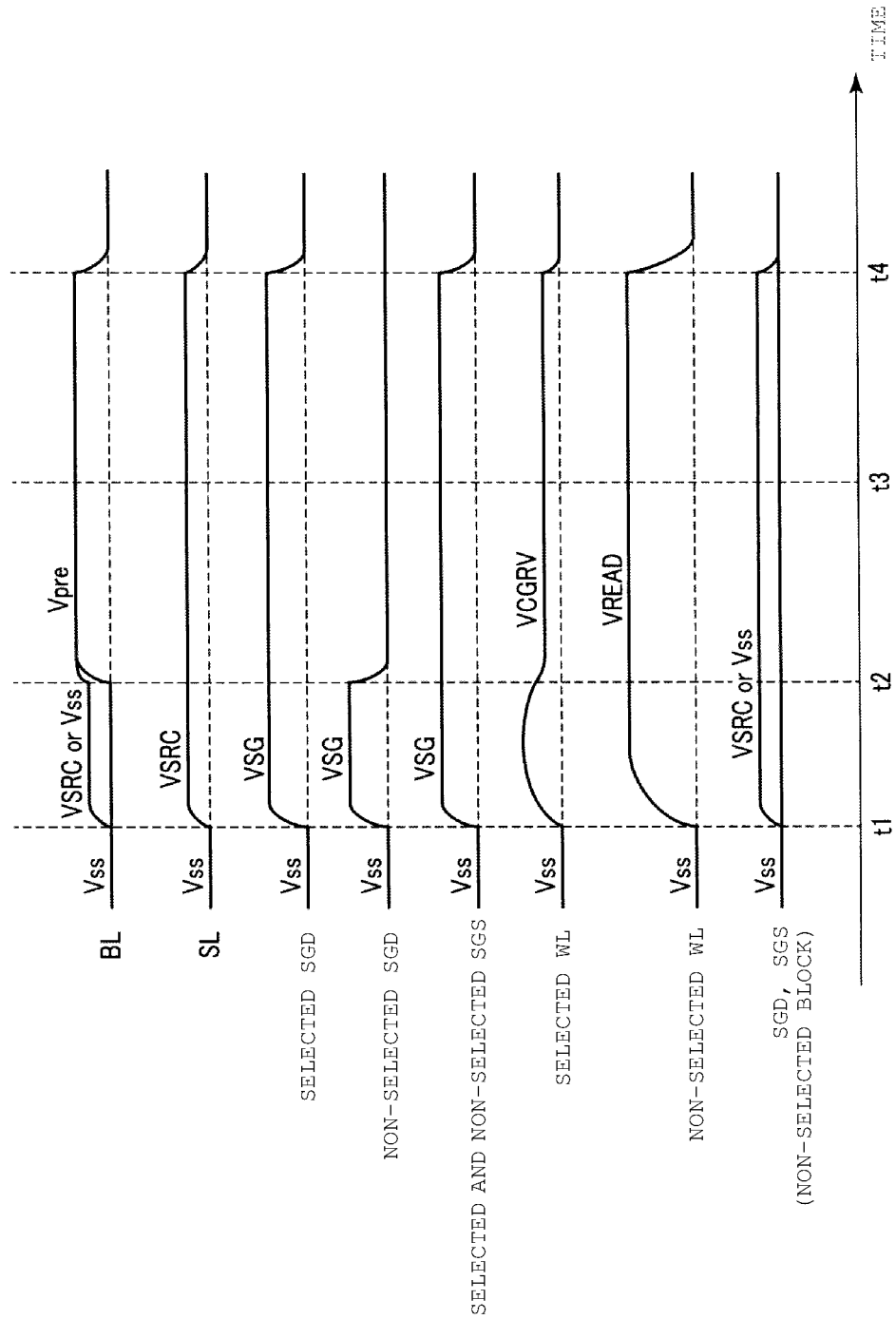
FIG. 11 is a timing chart illustrating a read operation according to a comparative example.

FIG. 11 is a timing chart illustrating the read operation according to a comparative example. In the comparative example, at time t2, the controller 20 applies the voltage Vss (e.g., ground voltage) to the non-selected SGD. Thereby, the selection transistors ST1 in the non-selected NAND strings are turned off. In the comparative example, a voltage difference between a voltage of the non-selected SGD and a voltage of the word line adjacent thereto is increased.

Figure 12A:
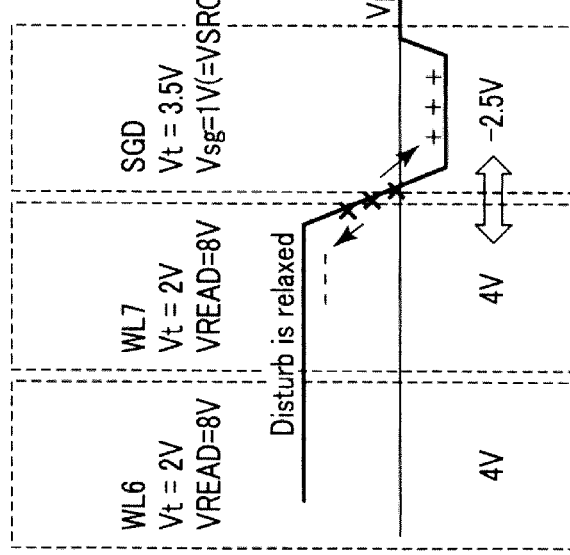
FIGS. 12A and 12B are schematic energy band diagrams illustrating read disturbance.
Figure 12B:
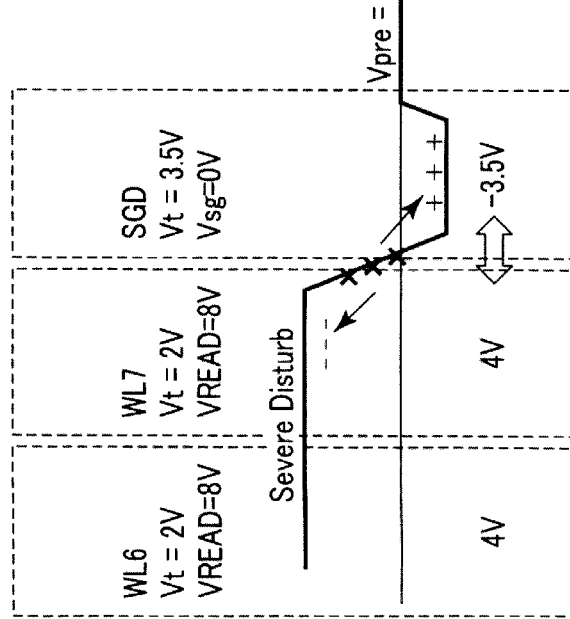

FIGS. 12A and 12B are schematic energy band diagrams illustrating the read disturbance. FIG. 12A is the comparative example, and FIG. 12B illustrates the present embodiment.

For example, a threshold voltage Vt of the memory cell is Vt=2 V, a threshold voltage Vt of the selection transistor ST1 is Vt=3.5 V, VREAD=8 V, VSRC=1 V, and Vpre=1.5 V (or 1 V). For example, the channel is raised to approximately 4 V by the read pass voltage VREAD which is applied to the non-selected word lines WL6 and WL7.

In the comparative example, 0 V is applied to the selection gate lines SGD, and the channel of the selection transistor ST1 is approximately −3.5 V. In contrast to this, in the present embodiment, the voltage VSRC (=1 V) is applied to the selection gate lines SGD, and the channel of the selection transistor ST1 is approximately −2.5 V. Thereby, in the present embodiment, a voltage difference of the channel between the selection gate line SGD and the word line WL7 adjacent thereto is reduced, and the read disturbance is reduced.

2-2. Operation of Bit Line Shield Method

FIG. 13 is a timing chart illustrating the read operation of the NAND type flash memory 10 according to a bit line shield method. In the bit line shield method, the voltage Vss is applied to the odd-numbered bit lines when data is read from the even-numbered bit lines. Similarly, the voltage Vss is applied to the even-numbered bit lines when the data is read from the odd-numbered bit lines. Hereinafter, only the operation different from that of the ABL method will be described.

At time t2, the controller 20 applies the voltage VSRC to the selected SGS and the non-selected SGS. Then, the selection transistors ST2 in the selected NAND strings and the non-selected NAND strings are turned off. Thereby, a current does not flow through the NAND strings, and the bit lines BL can be reliably charged by the precharge voltage Vpre.

A voltage which is applied to the selection gate lines SGS at time t2 is not limited to the voltage VSRC in the same manner as the source line and may be a voltage which cuts off the selection transistors ST2. That is, the voltage which is applied to the selection gate lines SGS at the point of time t2 is higher than the voltage Vss, and may be equal to or lower than a voltage which is obtained by adding the threshold voltage of the selection transistor ST2 to the voltage VSRC of the source line.

At time t3, the controller 20 applies the voltage VSG to the selection gate lines SGS. Thereafter, the sense amplification unit 14 determines the voltage of the bit line, thereby reading the data of the memory cell.

COMPARISON EXAMPLE

Figure 14:
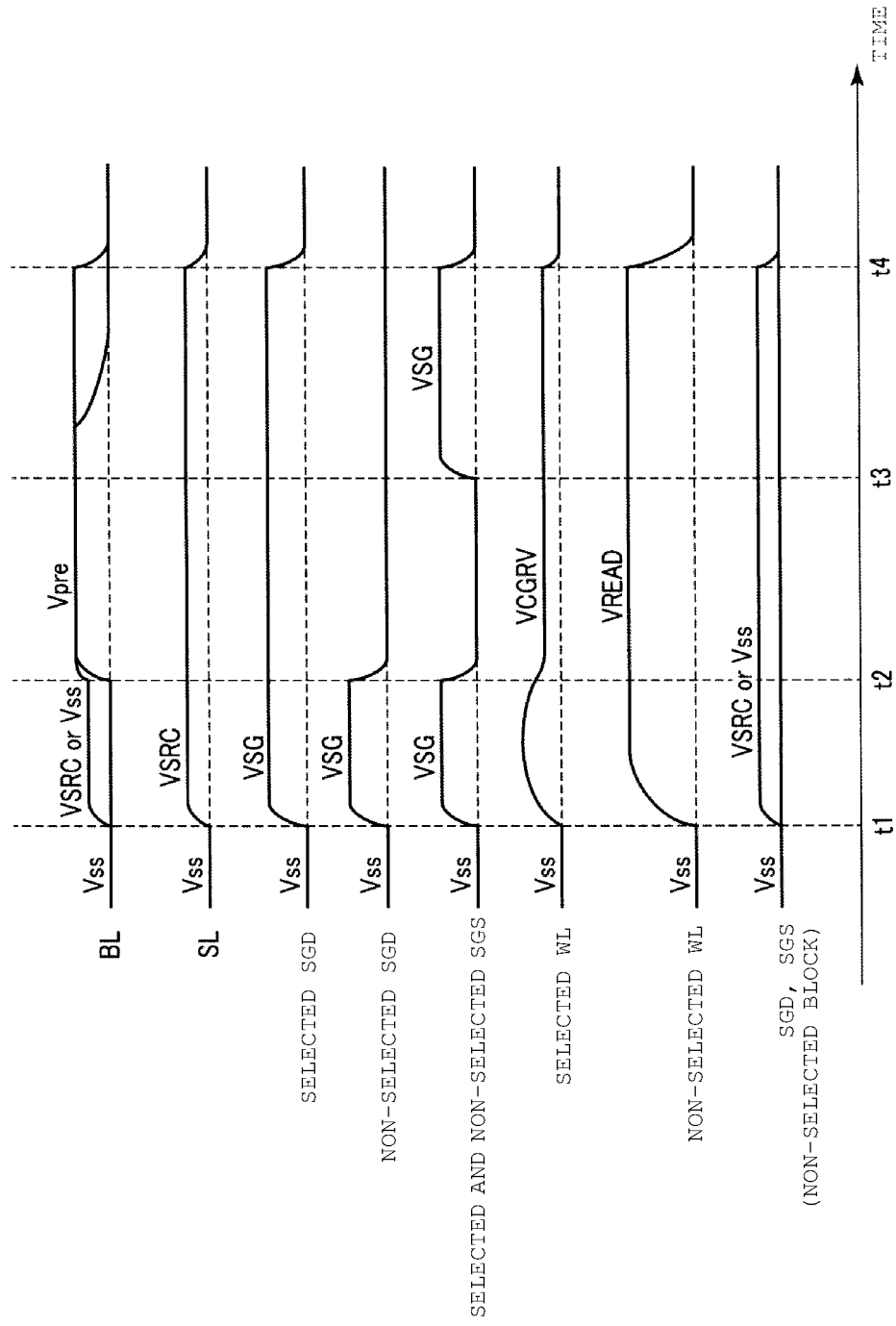
FIG. 14 is a timing chart illustrating a read operation according to the comparative example.

FIG. 14 is a timing chart illustrating the read operation according to the comparative example. In the comparative example, at time t2, the controller 20 applies the voltage Vss to the non-selected SGD, the selected SGS, and the non-selected SGS. Thereby, the selection transistors ST1 in the non-selected NAND strings are turned off. In addition, the selection transistors ST2 in the selected NAND strings and the non-selected NAND strings are turned off.

In the same manner as in the ABL method, in the comparative example a voltage difference between the non-selected SGD and the word line adjacent thereto is increased. However, in the present embodiment, a voltage difference of the channel between the selection gate line SGD and the word line WL adjacent thereto is reduced, and the read disturbance is reduced.

3. Effects of Embodiments

For example, it is assumed that there is arranged a dummy cell adjacent to the selection gate line SGD. Since the number of times that the read disturbance occurs in the dummy cell adjacent to the selection gate lines SGD is as much as the number of the word lines WL compared to the normal memory cells, disturbance occurs in the dummy cell, even though disturbance of the normal memory cell is within an allowable range. When a threshold voltage of the dummy cell increases to a level which affects a cell current (current flowing through the NAND string when data is read), this threshold voltage affects the read operation.

In the present embodiment, during a negative sense operation of biasing the source line SL to the positive voltage VSRC of approximately 1 V and not the voltage Vss, the voltage VSRC which is equal to a voltage that is applied to, for example, the source line SL is applied to the selection gate lines SGD of the non-selected NAND strings. Thereby, a voltage difference of a channel between the selection gate line SGD and a dummy word line WL adjacent thereto is reduced. As a result, it is possible to prevent the read disturbance caused by the hot carriers which are injected into the dummy cell (or memory cell) adjacent to the selection gate lines SGD from occurring.

MODIFICATION EXAMPLE

When one memory cell transistor MT stores two bit data, a threshold voltage thereof is set to any one of four levels according to the stored data. When the four levels are referred to as an erasure level, an A-level, a B-level, and a C-level in an ascending order, a voltage which is applied to a selected word line at the time of an A-level read operation is, for example, between 0 V and 0.55 V. The voltage is not limited to this, and may be between 0.1 V and 0.24 V, between 0.21 V and 0.31 V, between 0.31 V and 0.4 V, between 0.4 V and 0.5 V, or between 0.5 V and 0.55 V. A voltage which is applied to a selected word line at the time of a B-level read operation is, for example, between 1.5 V and 2.3 V. The voltage is not limited to this, and may be between 1.65 V and 1.8 V, between 1.8 V and 1.95 V, between 1.95 V and 2.1 V, or between 2.1 V and 2.3 V. A voltage which is applied to a selected word line at the time of a C-level read operation is, for example, between 3.0 V and 4.0 V. The voltage is not limited to this, and may be between 3.0 V and 3.2 V, between 3.2 V and 3.4 V, between 3.4 V and 3.5 V, between 3.5 V and 3.6 V, or between 3.6 V and 4.0 V. Time (tR) of the read operation may be, for example, between 25 μs and 38 μs, between 38 μs and 70 μs, or between 70 μs and 80 μs.

The write operation includes a program and program verification process. In the write operation, a voltage which is first applied to the word line that is selected at the time of programming is, for example, between 13.7 V and 14.3 V. The voltage is not limited to this, and may be, for example, between 13.7 V and 14.0 V, or between 14.0 V and 14.6 V. A voltage which is first applied to the word line that is selected when data is written to odd-numbered word lines may be changed with a voltage which is first applied to the word line that is selected when data is written to even-numbered word lines. When the program operation is performed according to an incremental step pulse program (ISPP) method, it is recommended that, for example, approximately 0.5 V is used as a step-up voltage increment. A voltage which is applied to a non-selected word line may be, for example, between 6.0 V and 7.3 V. The voltage is not limited to this, and may be, for example, between 7.3 V and 8.4 V, or may be equal to or lower than 6.0 V. A pass voltage which is applied may be changed depending on whether the non-selected word lines are odd-numbered word lines or even-numbered word lines. Time (tProg) of the write operation may be, for example, between 1,700 μs and 1,800 μs, between 1,800 μs and 1,900 μs, or between 1,900 μs and 2,000 μs.

In the erasure operation, a voltage that is first applied to a well, which is formed on a semiconductor substrate and on which a memory cell is arranged, is, for example, between 12 V and 13.6 V. The voltage is not limited to this case, and may be, for example, between 13.6 V and 14.8 V, between 14.8 V and 19.0 V, between 19.0 V and 19.8 V, or between 19.8 V and 21 V. Time (tErase) of the erasure operation may be, for example, between 3,000 μs and 4,000 μs, between 4,000 μs and 5,000 μs, or between 5,000 μs and 9,000 μs.

In addition, the memory cell may have, for example, the following structure. The memory cell includes a charge storage layer which is arranged on the semiconductor substrate such as a silicon substrate through a tunnel insulating film whose thickness is between 4 nm and 10 nm. The charge storage layer can have a stack structure of an insulating film such as a silicon nitride (SiN) film with a thickness of 2 nm to 3 nm or a silicon oxide (SiON) film, and a polysilicon (Poly-Si) film with a thickness of 3 nm to 8 nm. A metal such as ruthenium (Ru) may be added to the polysilicon film. The memory cell includes an insulating film formed on the charge storage layer. The insulating film has a silicon oxide ($SiO_2$) film with a thickness of 4 nm to 10 nm which is interposed between a lower layer High-k film with a thickness of 3 nm to 10 nm and an upper layer High-k film with a thickness of 3 nm to 10 nm. Hafnium oxide (HfO) or the like can be used as a material of the high-k films. In addition, the thickness of the silicon oxide film may be greater than the thickness of the high-k film. A control electrode with a thickness of 30 nm to 70 nm is formed on the insulating film through a material for work function adjustment with a thickness of 3 nm to 10 nm. Here, the film for work function adjustment is a metal oxide film such as tantalum oxide (TaO), a metal nitride film such as tantalum nitride (TaN), or the like. Tungsten (W) or the like can be used as the control electrode. An air gap can be arranged between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a bit line;
a source line;
a first memory string including:
a first select transistor having one end coupled to the bit line;
a first memory cell transistor having one end coupled to the other end of the first select transistor;

a second memory cell transistor having one end coupled to the other end of the first memory cell transistor; and
a second select transistor having one end coupled to the other end of the second memory cell transistor and the other end coupled to the source line;
a second memory string including:
a third select transistor having one end coupled to the bit line;
a third memory cell transistor having one end coupled to the other end of the third select transistor;
a fourth memory cell transistor having one end coupled to the other end of the third memory cell transistor; and
a fourth select transistor having one end coupled to the other end of the fourth memory cell transistor and the other end coupled to the source line;
a first select gate line coupled to a gate of the first select transistor;
a second select gate line coupled to a gate of the third select transistor;
a first word line coupled to a gate of the first memory cell transistor and a gate of the third memory cell transistor;
a second word line coupled to a gate of the second memory cell transistor and a gate of the fourth memory cell transistor; and
a voltage generation circuit, wherein
during a first period of a read operation to read data from the first memory cell transistor, the voltage generation circuit:
applies a first voltage greater than a ground voltage to the first selection gate line,
applies a second voltage greater than the ground voltage to the second selection gate line,
applies a third voltage greater than the ground voltage to the first word line, and
applies a fourth voltage greater than the ground voltage to the second word line, and
during a second period of the read operation to read data from the first memory cell transistor after the first period, the voltage generation circuit:
applies a fifth voltage greater than the ground voltage to the first selection gate line,
applies a sixth voltage smaller than the fifth voltage and greater than the ground voltage to the second selection gate line,
applies a seventh voltage to the first word line, and
applies an eighth voltage greater than the seventh voltage to the second word line.

2. The semiconductor memory device according to claim 1, wherein, during the first period, the first word line is coupled to the second word line.

3. The semiconductor memory device according to claim 1, wherein
the first voltage is greater than a threshold voltage of the first select transistor,
the second voltage is greater than a threshold voltage of the second select transistor,
the fifth voltage is greater than the threshold voltage of the first select transistor, and
the second voltage is smaller than the threshold voltage of the second select transistor.

4. The semiconductor memory device according to claim 1, wherein
the fifth voltage is equal to the first voltage,
the seventh voltage is smaller than the third voltage, and
the eighth voltage is equal to the fourth voltage.

5. The semiconductor memory device according to claim 1, wherein the seventh voltage is greater than the ground voltage.

6. The semiconductor memory device according to claim 1, further comprising:
a third select gate line coupled to a gate of the second select transistor, wherein
during the first period, the voltage generation circuit:
applies a ninth voltage greater than the ground voltage to the third selection gate line, and
during the second period, the voltage generation circuit:
applies a tenth voltage greater than the ground voltage to the third selection gate line.

7. The semiconductor memory device according to claim 6, further comprising:
a fourth select gate line coupled to a gate of the fourth select transistor, wherein
during the first period, the voltage generation circuit:
applies an eleventh voltage greater than the ground voltage to the fourth selection gate line, and
during the second period, the voltage generation circuit:
applies a twelfth voltage greater than the ground voltage to the fourth selection gate line.

8. The semiconductor memory device according to claim 7, wherein the voltage generation circuit applies a voltage to the third select gate line and the fourth select gate line, respectively.

9. The semiconductor memory device according to claim 1, further comprising:
a third select gate line coupled to a gate of the second select transistor and a gate of the fourth select transistor, wherein
during the first period, the voltage generation circuit:
applies a ninth voltage greater than the ground voltage to the third selection gate line, and
during the second period, the voltage generation circuit:
applies a tenth voltage greater than the ground voltage to the third selection gate line.

10. The semiconductor memory device according to claim 1, further comprising:
a substrate having a surface extending in a first direction and a second direction crossing the first direction, wherein
the first word line and second word line extend in the first direction and the second direction, and the first word line and second word line are stacked in a third direction crossing the first direction and the second direction,
the first selection gate line and the second selection gate line extend in the first direction and the second direction, the first selection gate line and the second selection gate line are located at the same level along the third direction, and first selection gate line and the second selection gate line are aligned with each other in the first direction, and
the bit line extends in the second direction.

11. The semiconductor memory device according to claim 10, wherein the substrate is coupled to the source line.

12. The semiconductor memory device according to claim 11, further comprising:
a first semiconductor pillar extending in the third direction and having one end coupled to the substrate and the other end coupled to the bit line,
a first charge storage film surrounding the first semiconductor pillar to face the first word line and the second word line, a second semiconductor pillar extending in the third direction and having one end coupled to the substrate and the other end coupled to the bit line, and a second charge storage film surrounding the second semiconductor pillar to face the first word line and the second word line.

13. The semiconductor memory device according to claim 12, wherein the first semiconductor pillar, the first charge storage film and the first word line form the first memory cell transistor, the first semiconductor pillar, the first charge storage film and the second word line form the second memory cell transistor, the second semiconductor pillar, the second charge storage film and the first word line form the third memory cell transistor and, the second semiconductor pillar, the second charge storage film and the second word line form the fourth memory cell transistor.

* * * * *